(12) United States Patent  
Furuichi

(10) Patent No.: US 8,992,160 B2  
(45) Date of Patent: Mar. 31, 2015

(54) TRANSFER ROBOT

(71) Applicant: Kabushiki Kaisha Yaskawa Denki, Kitakyushu-shi (JP)

(72) Inventor: Masatoshi Furuichi, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 106 days.

(21) Appl. No.: 13/666,906

(22) Filed: Nov. 1, 2012

(65) Prior Publication Data

US 2013/0195598 A1   Aug. 1, 2013

(30) Foreign Application Priority Data

Jan. 31, 2012  (JP) .................................. 2012-018980

(51) Int. Cl.  
*B25J 21/00* (2006.01)  
*H01L 21/677* (2006.01)

(52) U.S. Cl.  
CPC ......... *H01L 21/67742* (2013.01); *Y10S 901/17* (2013.01)  
USPC .............. 414/744.3; 414/222.07; 414/222.13; 901/17

(58) Field of Classification Search  
CPC .................. H01L 21/67196; H01L 21/67742; H01L 21/677; H01L 21/68; B25J 19/0075; B25J 19/06  
USPC .............. 74/608, 612; 414/744.3, 744.5, 937, 414/939; 901/49  
See application file for complete search history.

(56) References Cited

U.S. PATENT DOCUMENTS

| 7,874,782 | B2 | 1/2011 | Hashimoto | |
|---|---|---|---|---|
| 2008/0025824 | A1* | 1/2008 | Hashimoto | ................ 414/217.1 |
| 2008/0218772 | A1* | 9/2008 | Binns et al. | ................... 356/622 |
| 2010/0172720 | A1 | 7/2010 | Kondoh | |
| 2011/0041764 | A1* | 2/2011 | Webb et al. | ................... 118/715 |

FOREIGN PATENT DOCUMENTS

| JP | 61-222566 | 10/1986 |
|---|---|---|
| JP | 02-232194 | 9/1990 |
| JP | 04-085812 | 3/1992 |
| JP | 05-077193 | 3/1993 |
| JP | 05-317762 | 12/1993 |
| JP | 06-296913 | 10/1994 |

(Continued)

OTHER PUBLICATIONS

Korean Office Action for corresponding KR Application No. 2012-0148720, Dec. 20, 2013.

(Continued)

*Primary Examiner* — Saul Rodriguez  
*Assistant Examiner* — Ronald Jarrett  
(74) *Attorney, Agent, or Firm* — Mori & Ward, LLP

(57) ABSTRACT

A transfer robot according to an embodiment includes an arm and a body. The arm is provided, at a terminal end thereof, with a robot hand transferring a thin plate-like workpiece, and operates in horizontal directions. The body includes a lifting and lowering mechanism that lifts and lowers the arm. In the transfer robot, at least a part of the body is disposed outside a side wall of a transfer room that is connected to an opening and closing device opening and closing a storage container for the thin plate-like workpiece and to a processing room processing the thin plate-like workpiece.

9 Claims, 5 Drawing Sheets

(56) References Cited

FOREIGN PATENT DOCUMENTS

| | | | |
|---|---|---|---|
| JP | 07-040087 U | 7/1995 | |
| JP | 07-241787 | 9/1995 | |
| JP | 08-085090 | 4/1996 | |
| JP | 11-301813 | 11/1999 | |
| JP | 2000-061878 | 2/2000 | |
| JP | 2005-093812 | 4/2005 | |
| JP | 2006-005136 | 1/2006 | |
| JP | 2006-303012 | 11/2006 | |
| JP | 2007-152490 | 6/2007 | |
| JP | 2008-028134 | 2/2008 | |
| JP | 2008-264980 | 11/2008 | |
| JP | WO2009066573 * | 5/2009 | ............ H01L 21/677 |
| JP | 2010-069552 | 4/2010 | |
| JP | 2010-152618 | 7/2010 | |
| JP | 2010-179419 | 8/2010 | |
| JP | 2010-179420 | 8/2010 | |
| JP | 2011-035090 | 2/2011 | |
| JP | 2011-161629 | 8/2011 | |
| JP | 2011-228627 | 11/2011 | |
| JP | 2013-006235 | 1/2013 | |
| KR | 10-2009-0029687 | 3/2009 | |
| WO | WO 2009/066573 | 5/2009 | |

OTHER PUBLICATIONS

Japanese Office Action for corresponding JP Application No. 2012-018980, Jan. 7, 2014.

Korean Office Action for corresponding KR Application No. 10-2012-0148720, Jun. 10, 2014.

Korean Notice of Allowance for corresponding KR Application No. 10-2012-0148720, Jul. 28, 2014.

Taiwanese Office Action for corresponding TW Application No. 101142022, Aug. 25, 2014.

* cited by examiner

TRANSFER ROBOT

CROSS-REFERENCE TO RELATED APPLICATION

This application is based upon and claims the benefit of priority of the prior Japanese Patent Application No. 2012-018980, filed on Jan. 31, 2012, the entire contents of which are incorporated herein by reference.

FIELD

The embodiment discussed herein is directed to a transfer robot.

BACKGROUND

There are conventionally known transfer robots that transfer thin plate-like workpieces such as semiconductor wafers or liquid crystal panels.

In addition, there are proposed techniques, for example, of installing such a robot in a local clean room (hereinafter, referred to as a "transfer room") provided between a processing room and a storage container in which a plurality of semiconductor wafers are stored in multiple stages (refer, for example, to Japanese Patent Application Laid-open No. 2008-28134). Note that the transfer room is not limited to be installed between the storage container and the processing room.

However, when the transfer robot is installed in the transfer room, the transfer robot thus installed requires a predetermined occupation space in the transfer room. For this reason, there has been room for improvement in the transfer robot installed in the transfer room from the viewpoint of ensuring a sufficient space in the transfer room.

For example, insufficient space in the transfer room results in degradation in maintainability of the transfer robot. However, trying to prevent the degradation in maintainability necessitates increasing of the total space in the transfer room, that is, increasing of the size of the transfer room.

SUMMARY

A transfer robot according to an embodiment includes an arm and a body. The arm is provided, at a terminal end thereof, with a robot hand transferring a thin plate-like workpiece, and operates in horizontal directions. The body includes a lifting and lowering mechanism that lifts and lowers the arm. In the transfer robot, at least a part of the body is disposed outside a side wall of a transfer room that is connected to an opening and closing device opening and closing a storage container for the thin plate-like workpiece and to a processing room processing the thin plate-like workpiece.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENT

An embodiment of a transfer robot disclosed herein will be described below in detail with reference to the accompanying drawings. Note that the present invention is not limited to the embodiment illustrated below.

Figure 1:
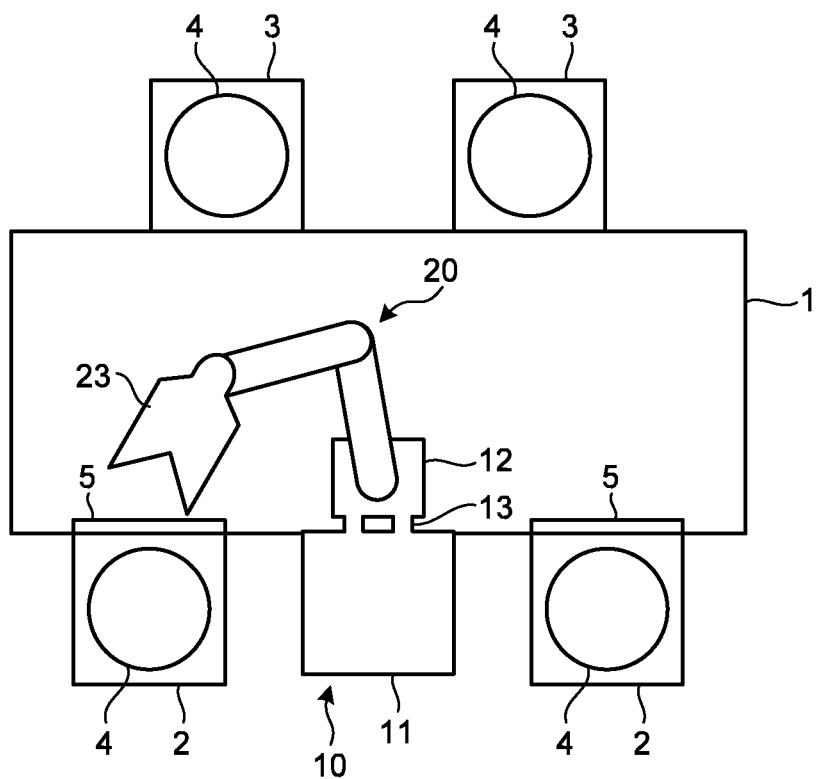
FIG. 1 is a top view of a transfer room according to an embodiment.

First, this transfer robot 10 according to the present embodiment will be described using FIG. 1. FIG. 1 is a top view of a transfer room 1 according to the present embodiment. Note that a part of the shape in FIG. 1 is illustrated in a simplified manner in order to facilitate the description.

As illustrated in FIG. 1, the transfer room 1 is provided with both opening and closing devices 5 and processing rooms 3 (or may be parts communicating with the processing rooms 3), and is arranged with the transfer robot 10 according to the present embodiment. The transfer room 1 refers to a local clean room generally called an equipment front end module (EFEM). This transfer room 1 is provided, at an upper part thereof, with a filter (not illustrated) for cleaning gas, and the gas flow that is cleaned by the filter and flows downward cleans the inside of the housing.

The opening and closing device 5 is a device for opening and closing an opening and closing mechanism provided on a storage container 2, and is installed at an opening formed on a side wall of the transfer room 1. The opening and closing device 5 is, for example, a device that is called a load port or a FOUP opener, and that is generally compliant with the Semiconductor Equipment and Materials International (SEMI) standard.

The SEMI standard specifies also positions of and intervals between the openings formed on the side wall of the transfer room 1. Therefore, the transfer room 1 is also compliant with the SEMI standard. For example, in the case of the transfer room 1 that processes semiconductor wafers having a diameter of 300 mm, the SEMI standard specifies the installation interval between the opening and closing devices 5 to be 505 mm.

The storage container 2 is a box-like container that can store a plurality of thin plate-like workpieces (hereinafter, referred to as the "wafers 4") such as semiconductor wafers or liquid crystal panels in multiple stages in the height direction, and has the opening and closing mechanism on the front face. The storage container 2 is, for example, a device called a front-opening unified pod (FOUP) specified in the SEMI standard.

The storage container 2 is loaded so as to come in contact, on the opening and closing mechanism side thereof, with the opening and closing device 5, and thus, the opening and closing device 5 opens and closes each of doors formed on the opening and closing mechanism and the opening and closing device 5.

The processing room 3 is a room installed with devices applying, to the wafer 4, predetermined processes such as chemical vapor deposition (CVD), exposure, etching, and asking.

The transfer robot 10 is a robot that can hold the wafer 4 serving as a transferred object. Specifically, the transfer robot 10 is provided with a body 11, an arm driving unit 12, supports 13, and an arm 20.

The arm 20 has a robot hand (hereinafter, referred to as the "hand 23") that can hold the wafer 4 serving as a transferred object. The arm 20 is supported so as to be rotatable in horizontal directions on top of the arm driving unit 12 connected to the supports 13 of the body 11 provided with a lifting and lowering mechanism.

With such a configuration, the transfer robot 10 can take the wafer 4 out of the storage container 2 and place the wafer 4 on the hand 23, can transfer the wafer 4 to a predetermined one of the processing rooms 3, and can transfer the wafer 4 to a targeted position, while lifting and lowering, and rotating the arm 20. Details of the arm 20 will be described later using FIG. 2.

Here, according to the conventional technology, when the transfer robot is installed in the transfer room 1, the transfer robot thus installed requires a predetermined occupation space in the transfer room 1. For this reason, there has been room for improvement in the transfer robot installed in the transfer room 1 from the viewpoint of ensuring a sufficient space in the transfer room 1.

For example, insufficient space in the transfer room 1 forces a worker to conduct maintenance work for the transfer robot in a narrow space, and thus results in degradation in maintainability of the transfer robot. However, trying to prevent the degradation in maintainability necessitates increasing of the total space in the transfer room 1, that is, increasing of the size of the transfer room 1.

Therefore, in the case of the transfer robot 10 according to the present embodiment, the body 11 of the transfer robot 10 is installed outside the transfer room 1 while the arm driving unit 12 and the arm 20 are installed inside the transfer room 1. With this configuration, the occupation space of the body 11 in the transfer room 1 can be eliminated, and thus, the space in the transfer room 1 can be used effectively.

In the case in which the worker conducts the maintenance work for the transfer robot 10, the worker conducts the work on the body 11 more often than on the arm driving unit 12 and the arm 20. This is because the arm 20 has, inside thereof, fewer portions to be adjusted by the worker.

In contrast, the body 11 is arranged with a linear motion guide, a ball screw, and the like, and in addition, with a pneumatic device (not illustrated) that controls holding of the wafer 4. Accordingly, a number of maintenance work items, such as greasing of the linear motion guide, the ball screw, and the like, and adjustment of the pneumatic device, are carried out on the body 11.

In this manner, in the case of the transfer robot 10 according to the present embodiment, the body 11 on which the maintenance work is often conducted is installed outside the transfer room 1, and thereby, many work items can be conducted outside the transfer room 1.

For this reason, in the case of the transfer robot 10 according to the present embodiment, the worker need not work in a narrow space, and thus can be eased from burden, and in addition, dust due to the maintenance work can be suppressed from rising in the transfer room 1.

Moreover, in the case of the transfer robot 10 according to the present embodiment, it is also possible, by retracting the arm 20 in the transfer room 1 upward or downward, to provide a wide space for the worker when the worker conducts maintenance other than the transfer robot 10 in the transfer room 1.

Figure 2:
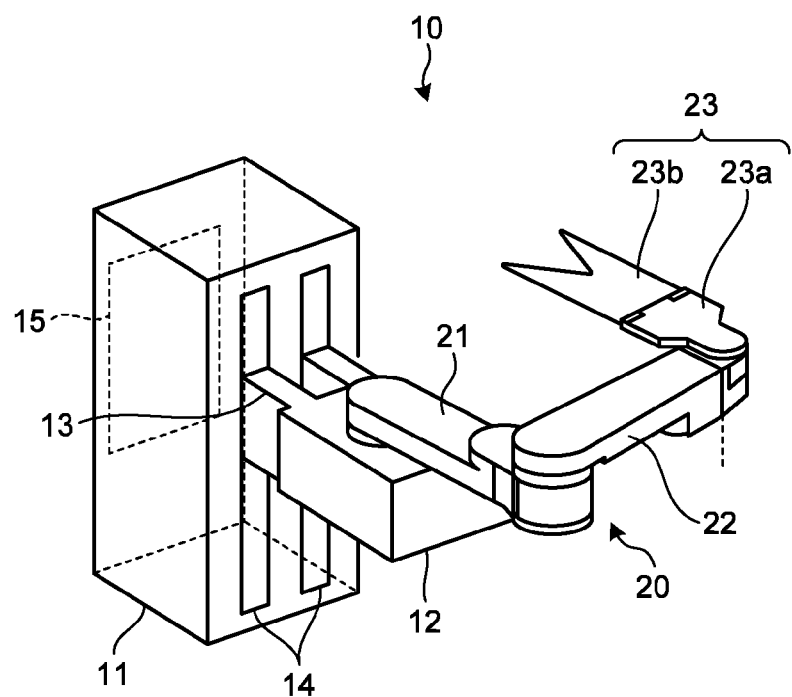
FIG. 2 is a schematic perspective view of a transfer robot according to the present embodiment.

Next, details of the transfer robot 10 according to the present embodiment will be described using FIG. 2. FIG. 2 is a schematic perspective view of the transfer robot 10 according to the present embodiment.

As illustrated in FIG. 2, the transfer robot 10 is a horizontal articulated robot which is provided with two extendable arms that extend and contract in horizontal directions. Specifically, the transfer robot 10 is provided with the body 11, the arm driving unit 12, the supports 13, slits 14, a cover 15, and the arm 20.

The body 11 is connected to the arm driving unit 12 via the supports 13. The body 11 is provided with, on the side face thereof opposed to the supports 13, the openable and closable cover 15. The cover 15 is opened and closed by the worker during the maintenance work in the body 11. The cover 15 may be a detachable plate-like cover, or may be a hinged door that opens and closes in an arc around a hinged portion serving as a pivot.

The body 11 is provided with the lifting and lowering mechanism, and, using the lifting and lowering mechanism, lifts and lowers the arm driving unit 12 and the arm 20 along the slits 14 opened in the vertical direction. Details of the lifting and lowering mechanism will be described later using FIGS. 4 and 5.

The arm 20 is a unit connected to the arm driving unit 12. Specifically, the arm 20 is provided with a first arm 21, a second arm 22, and the hand 23. Further, the hand 23 is provided with a third arm 23*a*, which in turn is provided, at the leading end thereof, with an end effector 23*b* that holds the wafer 4.

In the case of the transfer robot 10 according to the present embodiment, description will be made of a single-arm robot having a single arm 20 composed of the first arm 21, the second arm 22, and the hand 23. However, not limited to this configuration, the transfer robot 10 may be a dual-arm robot having two arms 20, or may be configured to be provided with three or more arms 20.

In the case of the dual-arm robot, two operations can be simultaneously performed in parallel in such a manner as follows: One of the arms 20 is used to take one of the wafers 4 out of a predetermined transfer position while the other of the arms 20 is used to carry a new one of the wafers 4 into the predetermined transfer position. Moreover, the transfer robot 10 may be configured such that the single second arm 22 is provided with two or more hands 23.

The arm driving unit 12 is a unit provided at a lower part of the arm 20, and is provided with a turning mechanism composed of a motor, a reduction gear, and other parts. The arm 20 is supported so as to be rotatable relative to the arm driving unit 12, and is rotated by using the turning mechanism.

The base end of the first arm 21 is supported on top of the arm driving unit 12, and the base end of the second arm 22 is supported on top of the leading end of the first arm 21, each being supported in a rotatable manner and rotated by using a turning mechanism composed of a motor, a reduction gear, and other parts.

In addition, the third arm 23*a* is rotatably connected to the leading end of the second arm 22. The third arm 23*a* is provided, at the leading end thereof, with the end effector 23*b* for holding the wafer 4, and the end effector 23*b* moves along with the rotational operations of the first arm 21, the second arm 22, and the third arm 23*a*. The transfer robot 10 can linearly move the third arm 23*a* and the end effector 23*b* by synchronously operating the first arm 21 and the second arm 22.

Although, here, the turning mechanism composed of the motor, the reduction gear, and other parts is provided inside the arm driving unit 12, a part of the turning mechanism, such as the motor, can be housed in the body 11.

Figure 3:
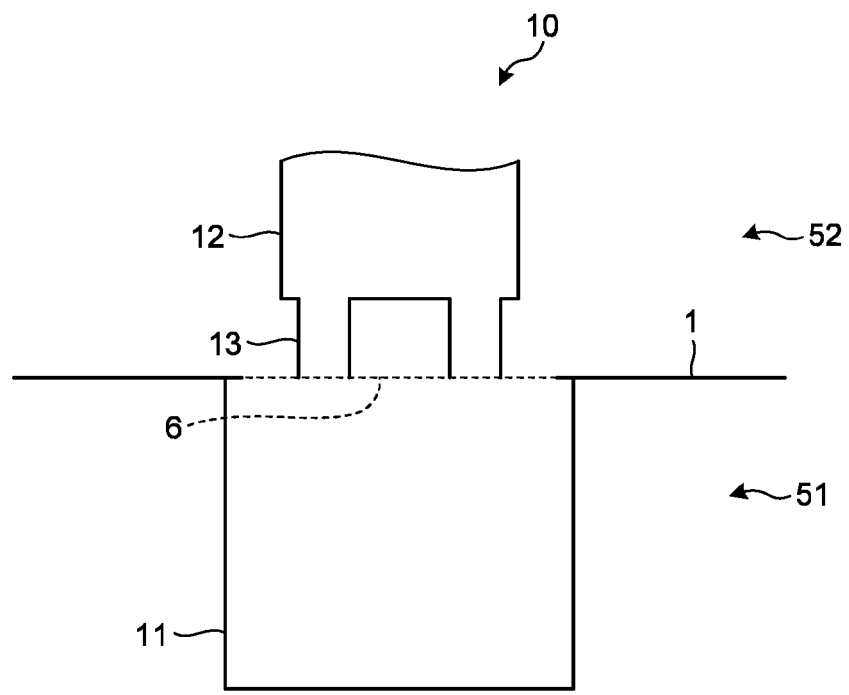
FIG. 3 is a top view of the transfer robot according to the present embodiment.

Next, the installation position of the transfer robot 10 will be described using FIG. 3. FIG. 3 is a top view of the transfer robot 10 according to the present embodiment.

As illustrated in FIG. 3, the transfer robot 10 is installed at the opening 6 formed on the side wall of the transfer room 1 so that the body 11 is positioned at an exterior 51 of the transfer room 1 while the arm driving unit 12 and the supports 13 are positioned at an interior 52 of the transfer room 1.

For example, the body 11 is mounted so as to be hung on a hook-like member provided at an upper part of the opening 6. When the arm driving unit 12 is configured to have a width not more than the width of the opening 6, the worker only needs to insert the transfer robot 10 into the opening 6 from the exterior 51 of the transfer room 1, and thus can easily install the transfer robot 10.

The opening 6 is an open mouth that is provided in advance in the side wall of the transfer room 1 for installing the opening and closing device 5, and that is compliant with the SEMI standard. The transfer robot 10 can be installed at any of such openings 6 formed on the transfer room 1.

For example, if three openings 6 are formed on a longitudinal side wall of the transfer room 1, the transfer robot 10 is installed at the opening 6 in the center. The transfer robot 10 moves the hand 23 to the storage container 2 loaded at another opening 6 and takes out the wafer 4 stored in the storage container 2.

The transfer robot 10 may also be installed at one of the openings 6 on the side of the processing rooms 3. In this manner, the transfer robot 10 can be easily installed any one of the openings 6 at the transfer room 1 that is provided with the openings 6 compliant with the SEMI standard.

Therefore, the transfer room 1 need not be modified for installing the transfer robot 10 according to the present embodiment. Thus, the transfer robot 10 makes it possible to reduce a cost required for installation and to make effective use of the space in the transfer room 1.

Here, the transfer robot 10 is installed so as to position the body 11 at the exterior 51 of the transfer room 1. However, not limited to this configuration, the transfer robot 10 may be buried in the opening 6 so that a part of the body 11 intrudes into the interior 52 of the transfer room 1.

Moreover, although the transfer robot 10 is installed at the opening 6 compliant with the SEMI standard, the embodiment is not limited to this configuration. The opening only needs to be an open mouth at which the transfer robot 10 can be installed so as to position the body 11 of the transfer robot 10 at the exterior 51 of the transfer room 1 and to position the arm driving unit 12 and the supports 13 of the transfer robot 10 at the interior of the transfer room 1.

In this case, even if the open mouth is not compliant with the SEMI standard, the transfer robot 10 can be easily installed at the open mouth from the exterior 51 of the transfer room 1 by configuring the arm driving unit 12 to have a width not more than the width of the open mouth.

Figure 4:
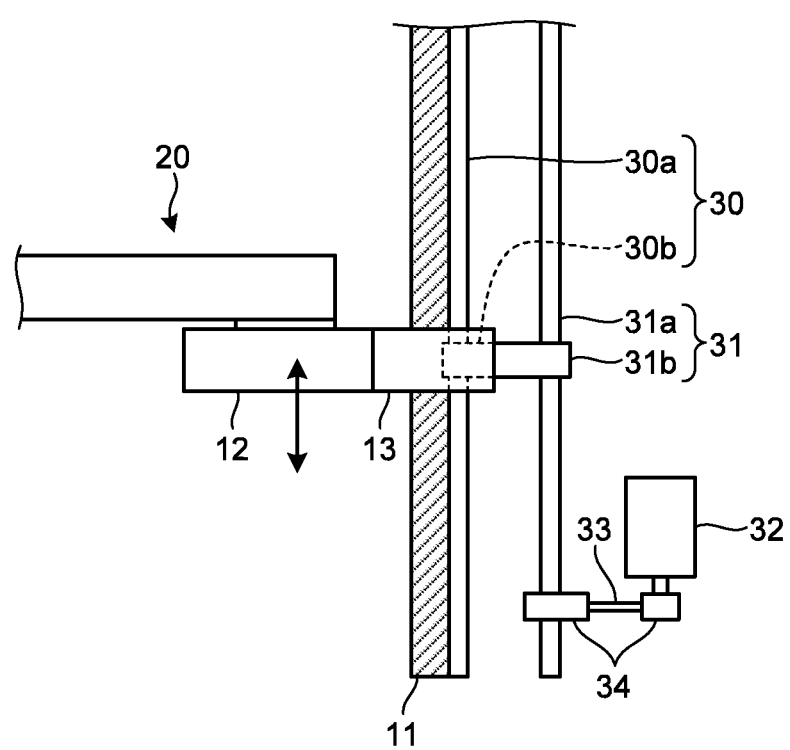
FIG. 4 is a side view of a lifting and lowering mechanism.
Figure 5:
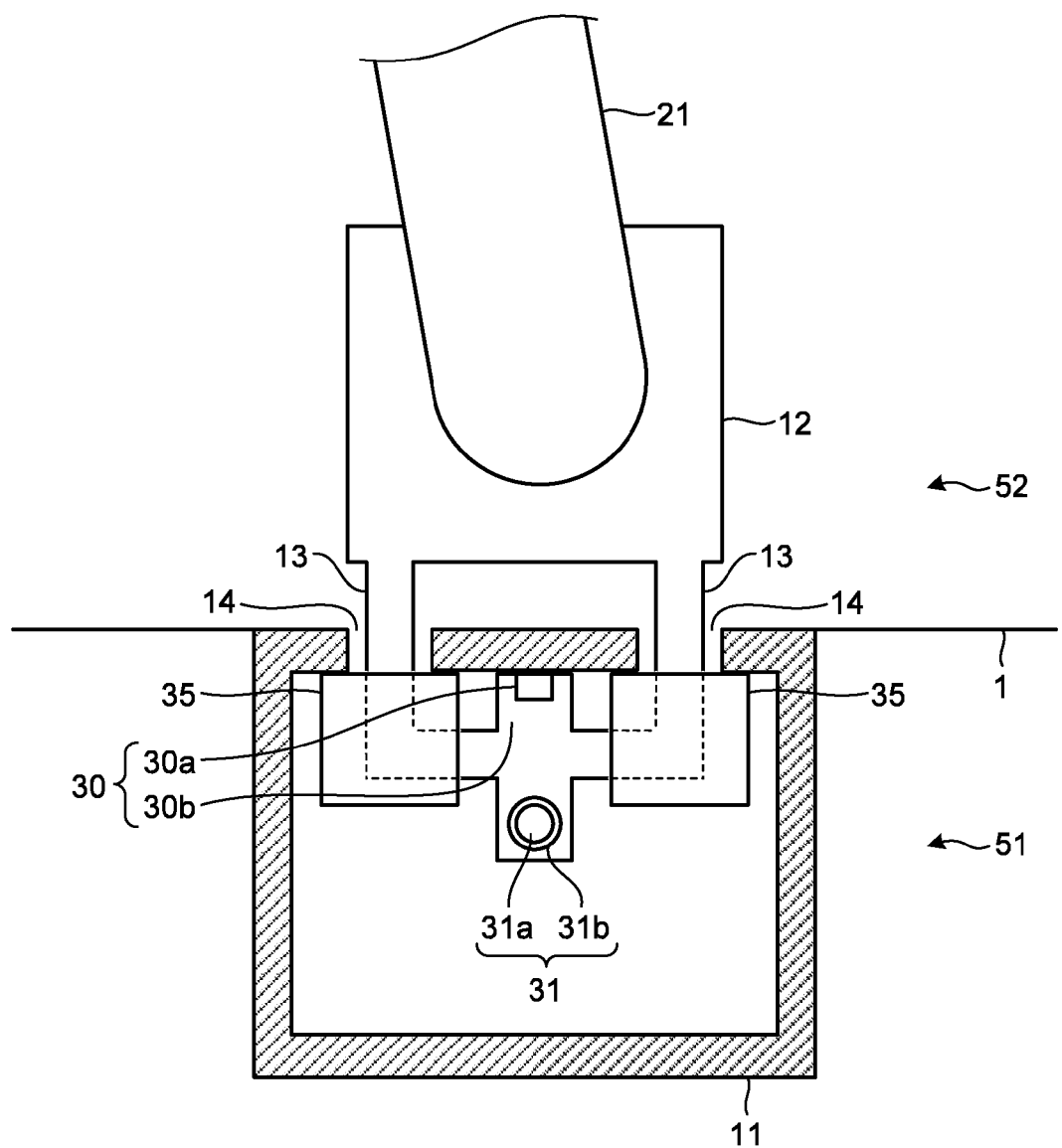
FIG. 5 is a top view of the lifting and lowering mechanism.

Next, the details of the lifting and lowering mechanism will be described using FIGS. 4 and 5. FIG. 4 is a side view of the lifting and lowering mechanism, and FIG. 5 is a top view of the lifting and lowering mechanism.

First, as illustrated in FIG. 4, as the lifting and lowering mechanism, the linear motion guide 30 is provided on a side wall on the interior side of the body 11, and the ball screw 31 is provided in the body 11, both along the vertical direction. The linear motion guide 30 is composed of a guide rail 30a and a slider 30b, and the ball screw 31 is composed of a ball screw shaft 31a and a ball screw nut 31b. The body 11 is provided therein with a motor 32, a belt 33, and pulleys 34.

The belt 33 is wound around the pulley 34 fixed to an output shaft of the motor 32 and the pulley 34 fixed to the ball screw shaft 31a. With this configuration, the belt 33 transmits a driving force of the motor 32 to the ball screw shaft 31a. The ball screw shaft 31a is rotated by the transmitted driving force of the motor 32.

The ball screw nut 31b moves up and down along the axis of rotation of the ball screw shaft 31a as a result of rotation of the ball screw shaft 31a inserted in the ball screw nut 31b.

The linear motion guide 30 is a member for smoothly making linear motion of the slider 30b in the direction of the guide rail 30a (in the vertical direction).

The slider 30b is connected to the ball screw nut 31b, and thus linearly moves directly in parallel with the axis of rotation of the ball screw shaft 31a, that is, along the vertical direction, as the ball screw nut 31b moves up and down. The slider 30b is also connected to the arm driving unit 12 via the supports 13, and thus, the arm driving unit 12 and the arm 20 move up and down along the vertical direction (arrow in FIG. 4) as the slider 30b linearly moves.

In this manner, the lifting and lowering mechanism is configured to include the linear motion guide 30, the ball screw 31, and the motor 32, and thus, lifts and lowers the arm driving unit 12 along the vertical direction by converting the rotational motion of the motor 32 into the linear motion. As a result, the arm 20 provided on top of the arm driving unit 12 moves up and down.

The linear motion guide 30, which is provided along the side wall on the interior side of the body 11 as described above, may be installed so that the guide rail 30a is buried in the side wall on the interior side of the body 11.

The lifting and lowering mechanism lifts and lowers the supports 13, the arm 20, and other parts using the ball screw 31 as described above. However, the lifting and lowering mechanism can lift and lower the supports 13, the arm 20, and other parts using a belt provided along the vertical direction.

According to the conventional technology, the body is provided at the bottom of the arm of the transfer robot. For this reason, the arm cannot go down below the body, and therefore, the movable range of the hand is limited.

Therefore, the transfer robot 10 according to the present embodiment is installed so as to position the body 11 provided with the lifting and lowering mechanism at the exterior 51 of the transfer room 1. As a result, the transfer robot 10 can have a wider lifting and lowering range of the arm 20 in the vertical direction, and thus can have a wider movable range of the hand 23.

As the arm 20 moves up and down, the pair of supports 13 provided in positions opposed to each other with the linear motion guide 30 interposed therebetween moves up and down along the slits 14 opened in the vertical direction, as illustrated in FIG. 5. So as to allow the supports 13 to smoothly move up and down at that time, the slits 14 are configured to have a larger width than that of the supports 13.

Due to this configuration, if gaps exist between the slits 14 and the supports 13, the cleaned interior of the transfer room 1 is contaminated by dust rising caused by the linear motion guide 30, the ball screw 31, the pulleys 34, and the belt 33. Therefore, in the case of the transfer robot 10 according to the present embodiment, open mouths of the slits 14 are covered by shielding members 35 having a larger width than that of the slits 14.

Here, the transfer robot 10 is provided with the pair of supports 13 in the positions opposed to each other with the linear motion guide 30 interposed therebetween. However, only one of the supports 13 provided in the transfer robot 10 may be configured to be connected to the lifting and lowering mechanism as described above. With this configuration, the lifting and lowering mechanism of the transfer robot 10 can be reduced in weight.

Figure 6:
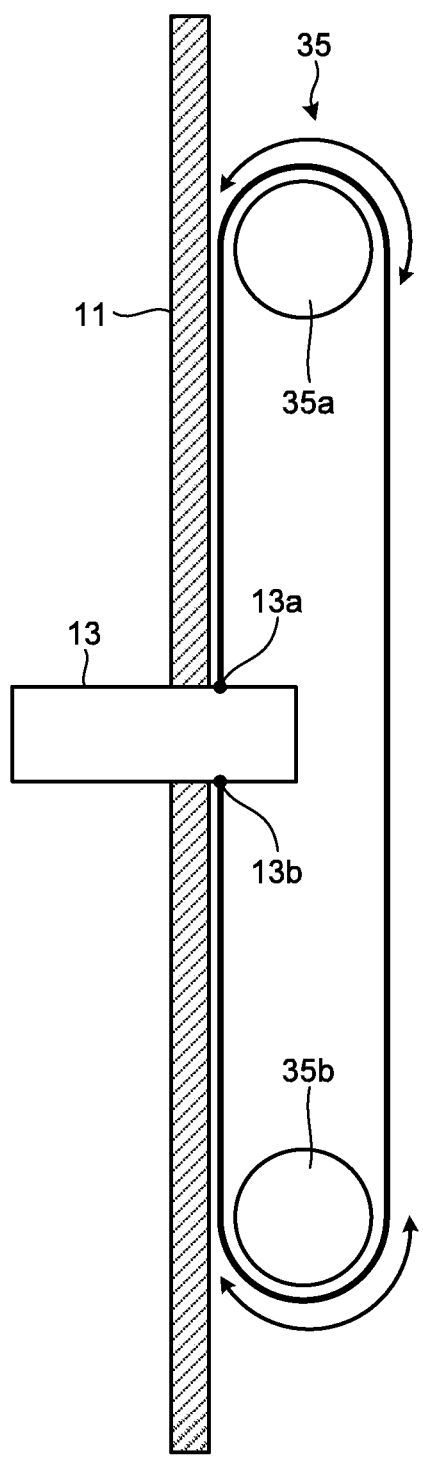
FIG. 6 is a side view of a shielding member.

Next, details of the shielding members 35 will be described using FIG. 6. FIG. 6 is a side view of one of the shielding members 35.

As illustrated in FIG. 6, the body 11 is provided with the shielding member 35 along the side wall on the interior side of the body 11 so as to cover the open mouth of the slit 14. The shielding member 35 is annular, and both ends thereof are connected to a top 13a and a bottom 13b of the support 13 that is lifted and lowered by the lifting and lowering mechanism.

The shielding member 35 is wound around rollers 35a and 35b provided on the upper end side and the lower end side, respectively, of the slit 14. The rollers 35a and 35b rotate along with movement of the shielding member 35 caused by the rise and fall of the support 13 (refer to arrows in FIG. 6).

As a result, the open mouth of the slit 14 is always covered by the shielding member 35 when the support 13 moves up and down.

By being configured in this manner, the transfer robot 10 can prevent the interior of the transfer room 1 from being contaminated by dust rising caused by the linear motion guide 30, the ball screw 31, the pulleys 34, and the belt 33.

Although the shielding member 35 is configured to rotate by being wound around the rollers 35a and 35b provided above and below the support 13, the embodiment is not limited to this configuration. The shielding member 35 may be, for example, a bellows-like curtain. In this case, a reduction in cost is possible because the rollers 35a and 35b are not required.

As described above, in the case of the transfer robot according to the present embodiment, the body of the transfer robot is installed outside the transfer room while the arm driving unit and the arm are installed inside the transfer room. In addition, in the case of the transfer robot according to the present embodiment, the openable and closable cover is provided on the side face opposed to the supports, and the open mouths of the slits are covered by the shielding members having a larger width than that of the slits.

By being configured in this manner, the transfer robot according to the present embodiment can make effective use of the space in the transfer room. The transfer robot according to the present embodiment can also improve maintainability of the transfer robot and maintainability of the interior of the transfer room as well. Furthermore, the transfer robot according to the present embodiment can prevent the cleaned interior of the transfer room from being contaminated by rising dust.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transfer robot comprising:
   an arm that is provided, at a terminal end thereof, with a robot hand configured to transfer a thin plate-like workpiece and that operates in horizontal directions;
   a body that includes a lifting and lowering mechanism configured to lift and lower the arm; and
   an arm driving unit that is configured to drive the arm, wherein
   at least a part of the body is disposed outside a side wall of a transfer room that is connected to an opening and closing device opening and closing a storage container for the thin plate-like workpiece and to a processing room processing the thin plate-like workpiece,
   the arm and at least a part of the arm driving unit are disposed inside the side wall of the transfer room,
   the body has a width not more than a width of the opening and closing device mounted on the side wall of the transfer room,
   the robot hand and a plurality of arm portions constituting the arm, and the arm driving unit each have a maximum width not more than a width of an opening of a plurality of openings on which the opening and closing device is mounted, and
   the width relationships allow for the transfer robot and/or opening and closing device to be mounted within the openings in any desired arrangement.

2. The transfer robot according to claim 1, wherein the body is mounted on the transfer room so as to position the lifting and lowering mechanism outside the side wall of the transfer room.

3. The transfer robot according to claim 2, wherein the arm is connected to the lifting and lowering mechanism via a support that passes through a vertically directed slit provided on the transfer room side of the body.

4. The transfer robot according to claim 3, further comprising a shielding member that is provided between the slit and the lifting and lowering mechanism and that is connected in both operating directions of the support so as to cover the slit.

5. The transfer robot according to claim 1, wherein the arm is connected to the lifting and lowering mechanism via a support that passes through a vertically directed slit provided on the transfer room side of the body.

6. The transfer robot according to claim 5, further comprising a shielding member that is provided between the slit and the lifting and lowering mechanism and that is connected in both operating directions of the support so as to cover the slit.

7. The transfer robot according to claim 1, wherein the body is disposed between two of the opening and closing devices when the transfer room is viewed from the top.

8. The transfer robot according to claim 1, wherein the body includes an openable and closable cover at a portion thereof projecting from the transfer room.

9. A transfer robot apparatus comprising:
   a transfer room that is connected to an opening and closing device configured to open and close a storage container for a thin plate-like workpiece and to a processing room processing the thin plate-like workpiece; and
   a transfer robot including:
      an arm that is provided, at a terminal end thereof, with a robot hand configured to transfer a thin plate-like workpiece and that operates in horizontal directions;
      a body that includes a lifting and lowering mechanism configured to lift and lower the arm; and
      an arm driving unit that is configured to drive the arm, wherein
   the transfer robot is inserted from an exterior of the transfer room so that the arm and at least a part of the arm driving unit are disposed inside a side wall of the transfer room, and at least a part of the body is disposed outside of the side wall of the transfer room,
   the body has a width not more than a width of the opening and closing device mounted on the side wall of the transfer room,
   the robot hand, a plurality of arm portions, and the arm driving unit each have a maximum width not more than a width of an opening of a plurality of openings on which the opening and closing device is mounted, and
   the width relationships allow for the transfer robot and/or opening and closing device to be mounted within the openings in any desired arrangement.

* * * * *